United States Patent
Lin et al.

(10) Patent No.: US 10,312,384 B2
(45) Date of Patent: Jun. 4, 2019

(54) SOLAR CELL

(71) Applicant: Industrial Technology Research Institute, Hsinchu (TW)

(72) Inventors: Chao-Cheng Lin, Taichung (TW); Chien-Kai Peng, Taipei (TW); Chen-Cheng Lin, Nantou County (TW); Chen-Hsun Du, Taipei (TW); Chorng-Jye Huang, Hsinchu (TW); Chun-Ming Yeh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 55 days.

(21) Appl. No.: 15/351,455

(22) Filed: Nov. 15, 2016

(65) Prior Publication Data
US 2018/0114871 A1   Apr. 26, 2018

(30) Foreign Application Priority Data
Oct. 26, 2016   (TW) .............................. 105134485 A

(51) Int. Cl.
*H01L 31/0224* (2006.01)
*H01L 31/028* (2006.01)
(Continued)

(52) U.S. Cl.
CPC .... *H01L 31/022433* (2013.01); *H01L 31/028* (2013.01); *H01L 31/022425* (2013.01);
(Continued)

(58) Field of Classification Search
CPC ..... H01L 31/022433; H01L 31/022466; H01L 31/028; H01L 31/1804
(Continued)

(56) References Cited

U.S. PATENT DOCUMENTS

| 8,686,283 B2 | 4/2014 | Heng et al. |
| 9,024,177 B2 | 5/2015 | Chen et al. |

(Continued)

FOREIGN PATENT DOCUMENTS

| CN | 102856328 | 1/2013 |
| CN | 103022181 | 4/2013 |

(Continued)

OTHER PUBLICATIONS

Mann et al., Dielectric particle and void resonators for thin film solar cell textures, Optics Express, vol. 19, No. 25 pp. 5729-57240 (Year: 2011).*

(Continued)

*Primary Examiner* — Jayne L Mershon
(74) *Attorney, Agent, or Firm* — JCIPRNET

(57) ABSTRACT

A solar cell is provided. The solar cell includes a Si substrate having a first surface and a second surface opposite to each other, an emitter, a first electrode, a doped region, a passivation layer, a doped polysilicon layer, a semiconductor layer, and a second electrode. The emitter is disposed on the first surface. The first electrode is disposed on the emitter. The doped region is disposed in the second surface. The passivation layer is disposed on the second surface. The doped polysilicon layer is disposed on the passivation layer, wherein a plurality of holes penetrates the doped polysilicon layer and the passivation layer and exposes a portion of the second surface. The semiconductor layer is disposed on the doped polysilicon layer and in the holes. The band gap of the semiconductor layer is greater than that of the Si substrate. The second electrode is disposed on the semiconductor layer.

5 Claims, 3 Drawing Sheets

(51) Int. Cl.
*H01L 31/18* (2006.01)
*H01L 31/0747* (2012.01)

(52) U.S. Cl.
CPC .. *H01L 31/022466* (2013.01); *H01L 31/0747* (2013.01); *H01L 31/1804* (2013.01); *Y02E 10/547* (2013.01); *Y02P 70/521* (2015.11)

(58) Field of Classification Search
USPC ........................................................ 136/256
See application file for complete search history.

(56) References Cited

U.S. PATENT DOCUMENTS

| | | | |
|---|---|---|---|
| 9,082,908 B2 | 7/2015 | Chen et al. | |
| 2011/0056550 A1* | 3/2011 | Choi | H01L 31/02167 136/256 |
| 2013/0298973 A1* | 11/2013 | Xie | H01L 31/072 136/255 |
| 2014/0096817 A1 | 4/2014 | Xie et al. | |
| 2014/0096821 A1 | 4/2014 | Chen et al. | |
| 2014/0102524 A1 | 4/2014 | Xie et al. | |
| 2014/0166095 A1 | 6/2014 | Loscutoff et al. | |
| 2014/0283902 A1 | 9/2014 | Heng et al. | |
| 2015/0228841 A1* | 8/2015 | Murakami | H01L 31/022425 438/72 |
| 2015/0280021 A1* | 10/2015 | Harley | H01L 31/022441 136/255 |
| 2015/0280029 A1* | 10/2015 | Harley | H01L 31/022441 136/249 |
| 2018/0076341 A1* | 3/2018 | Faur | H01L 31/02168 |

FOREIGN PATENT DOCUMENTS

| | | |
|---|---|---|
| CN | 104718630 | 6/2015 |
| CN | 105895738 | 8/2016 |
| TW | 201238061 | 9/2012 |
| TW | 201537770 | 10/2015 |

OTHER PUBLICATIONS

Heng et al., ">23% High-Efficiency Tunnel Oxide Junction Bifacial Solar Cell With Electroplated Cu Gridlines," IEEE Journal of Photovoltaics, Jan. 2015, pp. 82-86.

Heng et al., "Commercialization of Tunnel Oxide Junction Based Cell and Module with Efficiency and Good Reliability," 28th European Photovoltaic Solar Energy Conference and Exhibition, Sep. 30-Oct. 4, 2013, pp. 952-955.

"Office Action of Taiwan Counterpart Application", dated Feb. 14, 2017, p. 1-p. 3.

Qiang Li et al., "Replacing the amorphous silicon thin layer with microcrystalline silicon thin layer in TOPCon solar cells", Solar Energy 135, Jun. 6, 2016, pp. 487-492.

P. Stradins et al., "Passivated Tunneling Contacts to N-Type Wafer Silicon and Their Implementation into High Performance Solar Cells", NREL CP-5J00-63259, Dec. 2014, pp. 1-4.

Kevin Lancaster et al., "Study of pinhole conductivity at passivated carrier-selected contacts of silicon solar cells", Energy Procedia 92, Aug. 2016, pp. 116-121.

"Office Action of China Counterpart Application," dated Jan. 24, 2019, p. 1-p. 8.

* cited by examiner

SOLAR CELL

CROSS-REFERENCE TO RELATED APPLICATION

This application claims the Taiwan application serial no. 105134485, filed on Oct. 26, 2016. The entirety of the above-mentioned patent application is hereby incorporated by reference herein and made a part of this specification.

TECHNICAL FIELD

The disclosure relates to a solar cell.

BACKGROUND

In the common tunneling solar cell, during the manufacturing process, a silicon oxide layer is generally grown at a side of the silicon wafer as a tunneling layer. However, the silicon oxide layer cannot have good passivation characteristics, and therefore a high-temperature annealing process needs to be performed to increase passivation quality.

The high-temperature annealing process is generally performed in a furnace. In the high temperature state, the silicon oxide layer grows such that the thickness thereof exceeds 2 nm. As a result, the carriers in the silicon wafer cannot be freely transported via the tunneling mechanism. Therefore, before the annealing process is performed, a doped amorphous silicon layer can be formed on the silicon oxide layer to prevent the exceeding growth of the silicon oxide layer. However, during the annealing process, the doped amorphous silicon layer is changed into a doped polysilicon layer, and holes passing through the doped amorphous silicon layer and the silicon oxide layer are generated at the same time. The generation of the holes significantly reduces the passivation capability of the silicon oxide layer. Moreover, since the band gap of polysilicon and the band gap of single-crystal silicon are both close to 1.1 eV, the surface defects of the silicon wafer cannot be effectively passivated, and therefore the open-circuit voltage (Voc) of the solar cell cannot be effectively improved.

SUMMARY

A solar cell of the disclosure includes a silicon substrate, an emitter, a first electrode, a doped region, a passivation layer, a doped polysilicon layer, a semiconductor layer, and a second electrode. The silicon substrate has a first surface and a second surface opposite to each other. The emitter is disposed on the first surface. The first electrode is disposed on the emitter. The doped region is disposed in the second surface. The passivation layer is disposed on the second surface. The doped polysilicon layer is disposed on the passivation layer, wherein a plurality of holes penetrates the doped polysilicon layer and the passivation layer and exposes a portion of the second surface. The semiconductor layer is disposed on the doped polysilicon layer and in the holes, wherein the band gap of the semiconductor layer is greater than the band gap of the silicon substrate. The second electrode is disposed on the semiconductor layer.

The solar cell of the disclosure includes a silicon substrate of a first conductivity type, a first doped region of the first conductivity type, a first passivation layer, a first doped polysilicon layer of the first conductivity type, a first transparent conductive layer, a first electrode, a second doped region of a second conductive type, a second passivation layer, a second doped polysilicon layer of the second conductive type, a semiconductor layer, and a second electrode. The silicon substrate of the first conductivity type has a first surface and a second surface opposite to each other. The first doped region of the first conductivity type is disposed in the first surface. The first passivation layer is disposed on the first surface. The first doped polysilicon layer of the first conductivity type is disposed on the passivation layer, wherein a plurality of first holes penetrates the first doped polysilicon layer and the first passivation layer and exposes a portion of the first surface. The first transparent conductive layer is disposed on the first doped polysilicon layer and in the first holes. The first electrode is disposed on the first transparent semiconductor layer. The second doped region of the second conductivity type is disposed in the second surface. The second passivation layer is disposed on the second surface. The second doped polysilicon layer of the second conductivity type is disposed on the second passivation layer, wherein a plurality of second holes penetrates the second doped polysilicon layer and the second passivation layer and exposes a portion of the second surface. The semiconductor layer is disposed on the second doped polysilicon layer and in the second holes, wherein the band gap of the semiconductor layer is greater than the band gap of the silicon substrate. The second electrode is disposed on the semiconductor layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
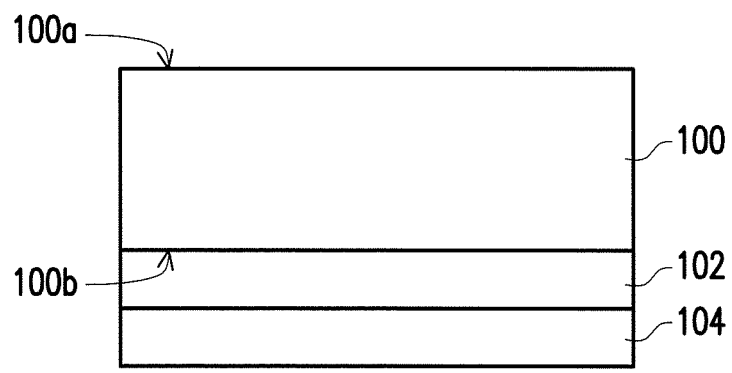
FIG. 1A to FIG. 1D are cross-sectional diagrams of the manufacturing process of a solar cell according to an embodiment of the disclosure.

FIG. 1A to FIG. 1D are cross-sectional diagrams of the manufacturing process of a solar cell according to an embodiment of the disclosure. First, referring to FIG. 1A, a silicon substrate 100 is provided. The silicon substrate 100 is, for instance, a silicon wafer. The silicon substrate 100 has a first surface 100a and a second surface 100b opposite to each other. In the present embodiment, before subsequent processes are performed, a cleaning treatment can be first performed on the silicon substrate 100. The cleaning process is, for instance, performed using hydrochloric acid and a hydrogen peroxide mixture (HPM).

Next, a passivation layer 102 is formed on the second surface 100b. The passivation layer 102 is, for instance, a silicon oxide layer, and the forming method thereof includes, for instance, performing an oxidation treatment on the second surface 100b. The thickness of the passivation layer 102 is, for instance, between 1 nm and 3 nm. The passivation layer 102 is used to passivate the defects of the second surface 100b to lower the probability of carrier recombination. Next, a doped amorphous silicon layer 104 is formed on the passivation layer 102. The forming method of the doped amorphous silicon layer 104 includes, for instance, performing a chemical vapor deposition process. The thickness of the doped amorphous silicon layer 104 is, for instance, between 15 nm and 300 nm. The doped amorphous silicon layer 104 can be used to prevent the passivation layer 102 from growing in a subsequent annealing treatment and becoming too thick and affecting the transport of carriers.

Figure 1B:
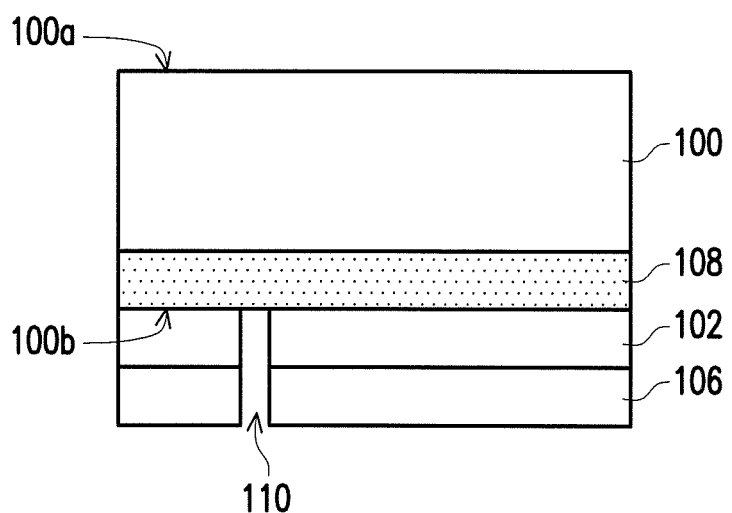

Next, referring to FIG. 1B, an annealing treatment is performed to change the doped amorphous silicon layer 104 into a doped polysilicon layer 106. The doped polysilicon layer 106 can produce a back electric field during the operation of the solar cell to reduce the number of the minority carrier located at the surface of the silicon wafer 100. Moreover, since the doped amorphous silicon layer 104 is formed on the passivation layer 102 beforehand, in the annealing process, exceeding growth of the passivation layer 102 can be effectively prevented, and as a result the issue of compromised transport of the carriers due to the passivation layer 102 being too thick is prevented. After the annealing treatment is performed, in addition to changing the doped amorphous silicon layer 104 into the doped polysilicon layer 106, the dopant in the doped amorphous silicon layer 104 is also diffused and passes through the doped amorphous silicon layer 104 and the passivation layer 102 and enters the second surface 100b of the silicon substrate 100 to form a doped region 108. At this point, a plurality of holes 110 caused by the annealing is formed in the doped polysilicon layer 106 and the passivation layer 102 and penetrates the doped polysilicon layer 106 and the passivation layer 102, and surface defects caused by the annealing are formed at the second surface 100b exposed by the holes 110. The pore size of the holes 110 does not exceed, for instance, 200 μm. In FIG. 1B, the number of the holes 110 is only schematic, and is not used to limit the disclosure.

Figure 1C:
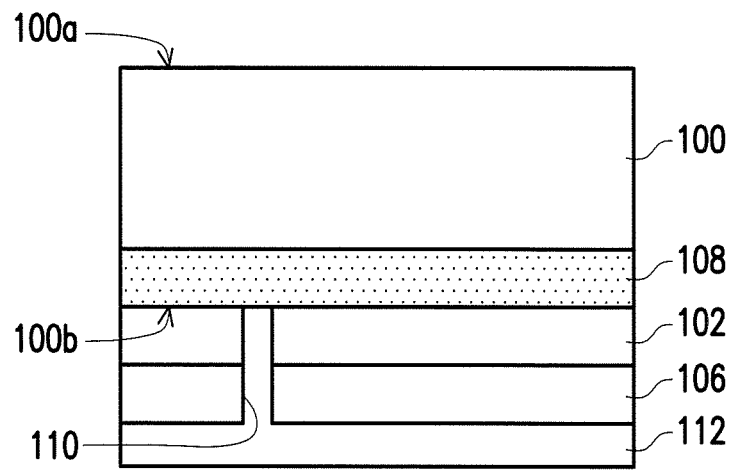

Next, referring to FIG. 1C, a semiconductor layer 112 is formed on the doped polysilicon layer 106 and in the holes 110. The forming method of the semiconductor layer 112 includes, for instance, performing a chemical vapor deposition process. It should be mentioned that, the band gap of the semiconductor layer 112 needs to be greater than the band gap of the silicon substrate 100. Specifically, the semiconductor layer 112 can be doped amorphous silicon, doped silicon carbide, silicon nitride, or silicon oxide, or the semiconductor layer 112 can be an undoped amorphous silicon layer. In the case that the semiconductor layer 112 is doped amorphous silicon, doped silicon carbide, silicon nitride, or silicon oxide, the semiconductor layer 112 is, for instance, between 5 nm and 50 nm. In the case that the semiconductor layer 112 is an undoped amorphous silicon layer, since the resistance of the undoped amorphous silicon layer is higher than the resistance of the doped amorphous silicon layer, the thickness of the undoped amorphous silicon layer needs to be smaller, such as less than 10 nm. In general, the band gap of the silicon substrate 100 is about 1.1 eV, and therefore the band gap of the semiconductor layer 112 is preferably greater than 1.1 eV.

Since the band gap of the semiconductor layer 112 is greater than the band gap of the silicon substrate 100, a potential barrier can be effectively built to stop the recombination of carriers. Moreover, since the semiconductor layer 112 is formed on the doped polysilicon layer 106 and in the holes 110, the surface of the doped polysilicon layer 106 and the second surface 100b exposed by the holes 110 can be effectively passivated to alleviate issues caused by the surface defects of the doped polysilicon layer 106 and the second surface 100b exposed by the holes 110. As a result, the open-circuit voltage of the resulting solar cell can be effectively increased to improve the performance of the solar cell.

Figure 1D:
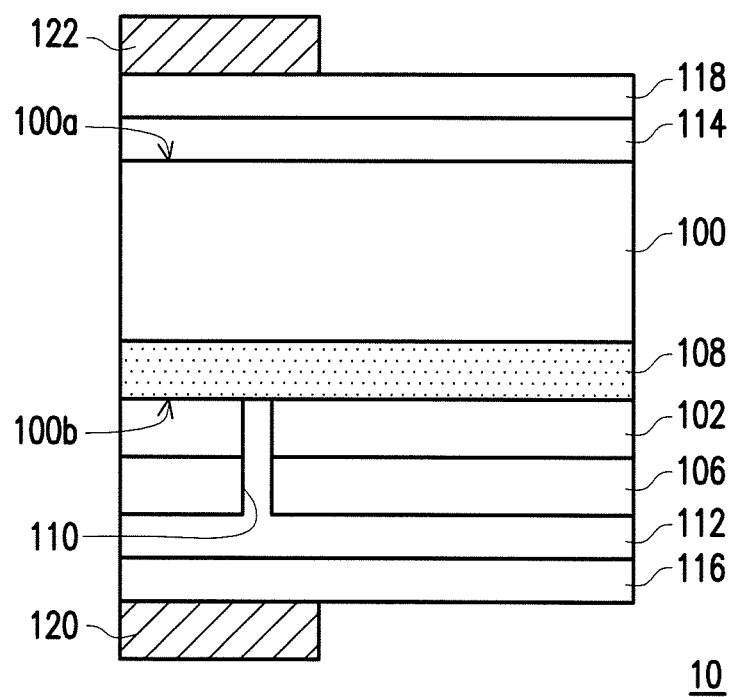

Next, referring to FIG. 1D, an emitter 114 is formed on the first surface 100a of the silicon substrate 100. The material of the emitter 114 is, for instance, amorphous silicon, and the forming method thereof includes, for instance, performing a chemical vapor deposition process. In an embodiment, the emitter 114 can be consisted of an undoped amorphous silicon layer and a doped amorphous silicon layer. It should be mentioned that, in each of the doped film layers described above, the silicon wafer 100, the doped region 108, the doped polysilicon layer 106, and the semiconductor layer 112 (doped) are all of a first conductivity type, and the emitter 114 is of a second conductivity type opposite to the film layers. For instance, the first conductivity type can be n-type, and the second conductivity type can be p-type. On the other hand, the first conductivity type can be p-type, and the second conductivity type can be n-type.

Next, transparent conductive layers 116 and 118 are optionally formed on the semiconductor layer 112 and the emitter 114 respectively. The material of the transparent conductive layers 116 and 118 is, for instance, indium tin oxide, and the forming method thereof includes, for instance, performing a physical vapor deposition process. The thickness of the transparent conductive layers 116 and 118 is, for instance, between 50 nm and 150 nm. Next, an electrode 120 is formed on the transparent conductive layer 116, and an electrode 122 is formed on the transparent conductive layer 118 to complete the manufacture of the solar cell 10 of the present embodiment.

Figure 2:
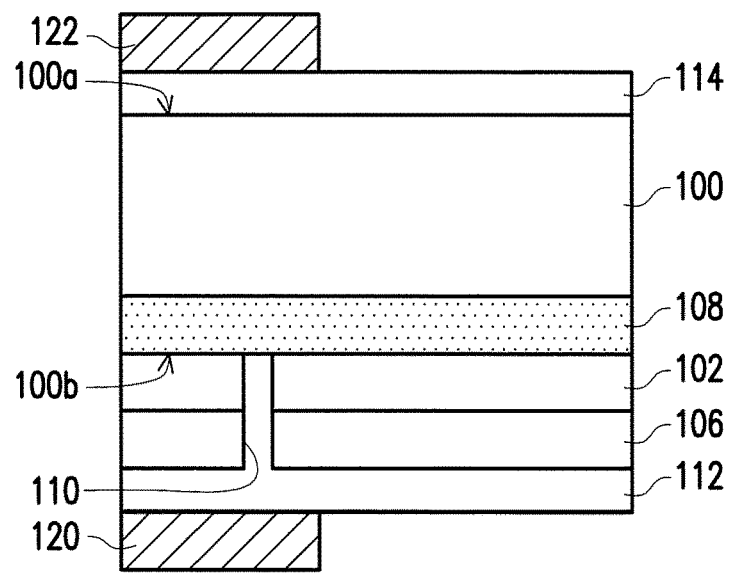
FIG. 2 is a cross-sectional diagram of a solar cell according to an embodiment of the disclosure.

The solar cell according to an embodiment of the disclosure is as shown in FIG. 2. In the present embodiment, the same reference numerals are used for the same devices in FIG. 1D. Referring to FIG. 2, a solar cell 20 includes a silicon substrate 100, a passivation layer 102, a doped polysilicon layer 106, a doped region 108, a semiconductor layer 112, an emitter 114, an electrode 120, and an electrode 122. The emitter 114 is disposed on the first surface 100a of the silicon substrate 100. The electrode 122 is disposed on the emitter 114. The doped region 108 is disposed in the second surface 100b of the silicon substrate 100. The passivation layer 102 is disposed on the second surface 100b. The doped polysilicon layer 106 is disposed on the passivation layer 102. A plurality of holes 110 penetrates the doped polysilicon layer 106 and the passivation layer 102. The holes 110 expose a portion of the second surface 100b. The semiconductor layer 112 is disposed on the doped polysilicon layer 106 and in the holes 110. The electrode 120 is disposed on the semiconductor layer 112. The material and size of each of the devices are as provided above and are not repeated herein.

In the solar cell 20, the band gap of the semiconductor layer 112 is greater than the band gap of the silicon substrate 100, and therefore a potential barrier can be effectively built to stop the recombination of carriers. Moreover, since the semiconductor layer 112 is disposed on the doped polysilicon layer 106 and in the holes 110, the surface of the doped polysilicon layer 106 and the second surface 100b exposed by the holes 110 can be effectively passivated. As a result, the open-circuit voltage of the resulting solar cell 20 can be effectively increased to improve the performance of the solar cell 20.

Moreover, in another embodiment, a transparent conductive layer (not shown) can be disposed between the electrode 122 and the emitter 114, and a transparent conductive layer (not shown) can be disposed between the electrode 120 and the semiconductor layer 112 to further reduce the resistance of the solar cell. The solar cell is, for instance, the solar cell 10 in FIG. 1D.

In the following, the effects of the solar cell of the disclosure are described via experimental examples. In the experimental examples, the structure of the solar cell 10 is used as an example.

Manufacture of Solar Cell

An n-type silicon wafer was cleaned using HPM ($H_2O$:HCl:$H_2O_2$=5:1:1) for 15 minutes;

the n-type silicon wafer was irradiated using UV for 5 minutes to grow a silicon dioxide passivation layer on a surface of the n-type silicon wafer;

a plasma-enhanced chemical vapor deposition process was performed to form an n-type amorphous silicon layer having a thickness of 15 nm to 30 nm on the passivation layer;

furnace annealing (850° C.) was performed for 30 minutes to change the n-type amorphous silicon layer into an n-type polysilicon layer and to make the n-type dopant diffuse and enter the n-type silicon wafer to form an n-type doped region and form holes in the n-type polysilicon layer and the passivation layer at the same time;

a plasma-enhanced chemical vapor deposition process was performed to form an n-type amorphous silicon layer on the n-type polysilicon layer and in the holes;

a plasma-enhanced chemical vapor deposition process was performed to form an undoped amorphous silicon layer and a p-type amorphous silicon layer on another surface of the n-type silicon layer to form an emitter;

a physical vapor deposition process was performed to form a transparent conductive layer on the n-type amorphous silicon layer and the emitter;

an electrode was respectively formed on the transparent conductive layer at two sides of the n-type silicon wafer.

An open-circuit voltage test was performed on the solar cell of the disclosure (an n-type amorphous silicon layer is disposed between the transparent conductive layer and the n-type polysilicon layer) formed by the manufacturing process above and a general solar cell (no n-type amorphous silicon layer is disposed between the transparent conductive layer and the n-type polysilicon layer). The open-circuit voltage of the solar cell of the disclosure is 693 mV, which is significantly greater than the open-circuit voltage of the general solar cell (675 mV). It can therefore be known that, in the solar cell of the disclosure, since an n-type amorphous silicon layer (the band gap thereof is greater than the band gap of the n-type silicon wafer) is disposed between the transparent conductive layer and the n-type polysilicon layer, the passivation effect can be increased to improve the open-circuit voltage of the solar cell.

In the above embodiments, a side of the silicon substrate has a passivation layer and a doped polysilicon layer, and the other side of the silicon substrate has an emitter, but the invention is not limited thereto. In other embodiments, both sides of the silicon substrate have a passivation layer and a doped polysilicon layer.

Figure 3:
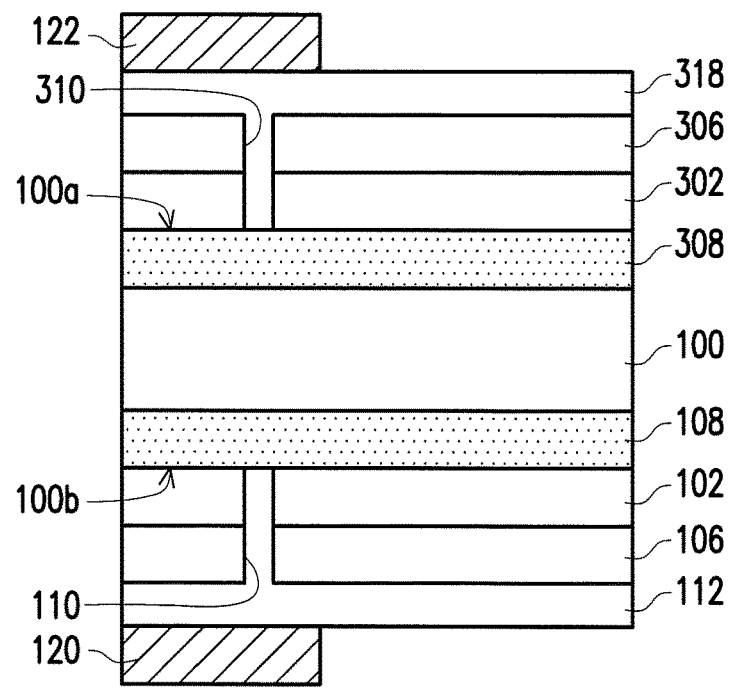
FIG. 3 is a cross-sectional diagram of a solar cell according to an embodiment of the disclosure.

FIG. 3 is a cross-sectional diagram of a solar cell according to an embodiment of the disclosure. In the present embodiment, the same devices in FIG. 2 are represented by the same reference numerals, and the materials and sizes of the devices are as provided above and are not repeated herein.

Referring to FIG. 3, a solar cell 30 includes a silicon substrate 100, a passivation layer 102, a doped polysilicon layer 106, a doped region 108, a semiconductor layer 112, an electrode 120, an electrode 122, a passivation layer 302, a doped polysilicon layer 306, a doped region 308, and a transparent conductive layer 318. In the present embodiment, the silicon substrate 100, the doped polysilicon layer 306, and the doped region 308 are of the first conductivity type, and the doped polysilicon layer 106, the doped region 108, and the semiconductor layer 112 (doped) are of the second conductivity type.

The doped region 108 is disposed in the second surface 100b of the silicon substrate 100. The passivation layer 102 is disposed on the second surface 100b. The doped polysilicon layer 106 is disposed on the passivation layer 102. A plurality of holes 110 penetrates the doped polysilicon layer 106 and the passivation layer 102. The holes 110 expose a portion of the second surface 100b. The semiconductor layer 112 is disposed on the doped polysilicon layer 106 and in the holes 110. The electrode 120 is disposed on the semiconductor layer 112.

The doped region 308 is disposed in the first surface 100a. The passivation layer 302 is disposed on the first surface 100a. The passivation layer 302 and the passivation layer 102 have the same or similar materials and thicknesses. The doped polysilicon layer 306 is disposed on the passivation layer 302. The thickness of the doped polysilicon layer 306 is, for instance, between 15 nm and 300 nm. A plurality of holes 310 penetrates the doped polysilicon layer 306 and the passivation layer 302, and the holes 310 expose a portion of the first surface 100a. The pore size of the holes 310 does not exceed, for instance, 200 μm. The transparent conductive layer 318 is disposed on the doped polysilicon layer 306 and in the holes 310. The thickness of the transparent conductive layer 318 is, for instance, between 50 nm and 150 nm. The electrode 122 is disposed on the transparent conductive layer 318.

In the solar cell 30, the band gap of the semiconductor layer 112 is greater than the band gap of the silicon substrate 100, and therefore a potential barrier can be effectively built to stop the recombination of carriers. Moreover, since the semiconductor layer 112 is disposed on the doped polysilicon layer 106 and in the holes 110, the surface of the doped polysilicon layer 106 and the second surface 100b exposed by the holes 110 can be effectively passivated. As a result, the open-circuit voltage of the resulting solar cell 30 can be effectively increased to improve the performance of the solar cell 30.

Moreover, in another embodiment, similar to the solar cell 10, a transparent conductive layer can be disposed between the electrode 120 and the semiconductor layer 112 to further reduce the resistance of the solar cell.

In the following, the effects of the solar cell of the disclosure are described via experimental examples. In the experimental examples, a structure similar to the structure of the solar cell 30 (a transparent conductive layer is disposed between the electrode 120 and the semiconductor layer 112) is used as an example.

Manufacture of Solar Cell

An n-type silicon wafer was cleaned using HPM ($H_2O$:HCl:$H_2O_2$=5:1:1) for 15 minutes;

the n-type silicon wafer was irradiated using UV for 5 minutes to grow a silicon dioxide passivation layer on a surface of the n-type silicon wafer;

a plasma-enhanced chemical vapor deposition process was performed to form an n-type amorphous silicon layer having a thickness of 15 nm to 30 nm on the passivation layer;

the resulting structure was immersed in a 1% HF solution for 1 minute;

the n-type silicon wafer was irradiated using UV for 5 minutes to grow a silicon dioxide passivation layer on another surface of the n-type silicon wafer;

a plasma-enhanced chemical vapor deposition process was performed to form a p-type amorphous silicon layer having a thickness of 15 nm to 30 nm on the passivation layer;

furnace annealing (850° C.) was performed for 30 minutes to respectively change the p-type amorphous silicon layer and the n-type amorphous silicon layer into a p-type polysilicon layer and an n-type polysilicon layer and to make the p-type dopant and the n-type dopant respectively diffuse and enter the n-type silicon wafer to form a p-type doped region and an n-type doped region and form holes in the p-type polysilicon layer, the n-type polysilicon layer, and the two passivation layers at the same time;

the resulting structure was immersed in a 1% HF solution for 1 minute;

a plasma-enhanced chemical vapor deposition process was performed to form a p-type amorphous silicon layer on the p-type polysilicon layer and in the holes;

a physical vapor deposition process was performed to form a transparent conductive layer on the p-type amorphous silicon layer and the n-type polysilicon layer;

an electrode was respectively formed on the transparent conductive layer at two sides of the n-type silicon wafer.

An open-circuit voltage test was performed on the solar cell of the disclosure (a p-type amorphous silicon layer is disposed between the transparent conductive layer and the p-type polysilicon layer) formed by the manufacturing process above and a general solar cell (no p-type amorphous silicon layer is disposed between the transparent conductive layer and the p-type polysilicon layer). The open-circuit voltage of the solar cell of the disclosure is 673 mV, which is significantly greater than the open-circuit voltage of the general solar cell (650 mV). It can therefore be known that, in the solar cell of the disclosure, since a p-type amorphous silicon layer (the band gap thereof is greater than the band gap of the n-type silicon wafer) is disposed between the transparent conductive layer and the p-type polysilicon layer, the passivation effect can be increased to improve the open-circuit voltage of the solar cell.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell, comprising:
   a silicon substrate having a first surface and a second surface opposite to each other;
   an emitter disposed on the first surface;
   a first electrode disposed on the emitter;
   a doped region disposed in the second surface;
   a passivation layer disposed on the second surface;
   a doped polysilicon layer disposed on the passivation layer, wherein a plurality of holes penetrates the doped polysilicon layer and the passivation layer and exposes a portion of the second surface;
   a semiconductor layer disposed on the doped polysilicon layer and in the holes, wherein a band gap of the semiconductor layer is greater than a band gap of the silicon substrate, and a material of the semiconductor layer is doped silicon carbide; and
   a second electrode disposed on the semiconductor layer.

2. The solar cell of claim 1, wherein a thickness of the semiconductor layer is between 5 nm and 50 nm.

3. The solar cell of claim 1, further comprising a transparent conductive layer disposed between the first electrode and the emitter.

4. The solar cell of claim 1, further comprising a transparent conductive layer disposed between the second electrode and the semiconductor layer.

5. The solar cell of claim 1, wherein a pore size of the holes does not exceed 200 μm.

* * * * *